United States Patent [19]
Radigan

[11] 4,351,696
[45] Sep. 28, 1982

[54] CORROSION INHIBITION OF ALUMINUM OR ALUMINUM ALLOY FILM UTILIZING BROMINE-CONTAINING PLASMA

[75] Inventor: Kenneth J. Radigan, Mountain View, Calif.

[73] Assignee: Fairchild Camera & Instrument Corp., Mountain View, Calif.

[21] Appl. No.: 315,693

[22] Filed: Oct. 28, 1981

[51] Int. Cl.³ ......................................... H01L 21/306
[52] U.S. Cl. ......................................... 156/643; 134/2; 156/646; 156/665; 204/192 E
[58] Field of Search ..................... 156/643, 646, 665; 134/2; 204/192 E

[56] References Cited

U.S. PATENT DOCUMENTS

| 4,073,669 | 2/1979 | Heinecke et al. | 156/643 |
|---|---|---|---|
| 4,256,534 | 3/1981 | Wevinstein et al. | 156/665 |
| 4,267,013 | 5/1981 | Iida et al. | 156/665 |
| 4,308,089 | 12/1981 | Iida et al. | 156/665 |
| 4,325,984 | 4/1982 | Palfo et al. | 156/643 |

FOREIGN PATENT DOCUMENTS

| 54-9387 | 8/1979 | Japan | 156/643 |
|---|---|---|---|
| 55-69268 | 5/1980 | Japan | 156/643 |

OTHER PUBLICATIONS

Chiu et al, "Plazma . . . Alloys" *IBM Technical Discl. Bull.*, vol. 21, No. 6, (11/78) p. 2315.
Lee et al, "Reactive . . . Process" *IBM Technical Discl. Bull.*, vol. 22, No. 8A, (1/80) p. 3347.
Crimi et al, "Etching . . . Alloys" *IBM Technical Discl. Bull.*, vol. 22, No. 8A, (1/80) p. 3196.

*Primary Examiner*—Jerome W. Massie
*Attorney, Agent, or Firm*—Kenneth Olsen; Michael J. Pollock; Theodore Scott Park

[57] ABSTRACT

Bromine-containing plasma is utilized to inhibit corrosion of aluminum or aluminum alloy films which have been etched utilizing a chlorinated plasma.

8 Claims, No Drawings

CORROSION INHIBITION OF ALUMINUM OR ALUMINUM ALLOY FILM UTILIZING BROMINE-CONTAINING PLASMA

FIELD OF THE INVENTION

The present invention relates to the etching of aluminum or aluminum alloy film and particularly to a method for inhibiting corrosion of such films utilizing bromine-containing plasma.

BACKGROUND

According to a conventional method for fabricating a semiconductor device, a thin film of aluminum or an aluminum alloy such as aluminum/silicon or aluminum/silicon/copper is deposited upon a layer of insulating material which is formed over a semiconductor substrate. The metallization layer is then masked and etched to form an electrode or conductor pattern.

Plasma etching of aluminum and aluminum alloy film to form conductor patterns has been practiced for some time. In a typical plasma-etching process for such films, selected portions of the film are exposed to a chlorine-containing plasma such as carbon tetrachloride or boron trichloride to form volatile aluminum trichloride. The aluminum trichloride is then removed resulting in a pre-patterned metallization image.

The volatility of aluminum trichloride is, however, somewhat marginal. Therefore, a relatively large amount of aluminum trichloride residue remains on the surface of the semiconductor wafer following the plasma etching process. In addition to aluminum trichloride, reacted chlorine species that have been adsorbed onto the surface of the wafer are also present at the end of the etch.

Removal of such residue is usually at the expense of penetration into the wafer substrate. Since the chlorine residuals, particularly aluminum trichloride, are hygroscopic, they delequiesce to form aluminum hydroxide and hydrochloric acid. The hydrochloric acid promptly etches, or corrodes, the metallization pattern. This causes loss of line dimension and possible catastrophic failure.

The more typically utilized aluminum alloys, such as aluminum/silicon, and particularly aluminum/silicon/copper, demonstrate this phenomenon on a significantly larger scale. Since copper is a non-volatile species in a chlorine plasma, the copper filters down to the substrate as the etch progresses. The copper retains a larger quantity of chlorine either adsorbed to its surface or in the form of copper chloride. These copper-chlorine compounds form copper hydroxide and hydrochloric acid.

Prior methods for alleviating the above-discussed corrosion problem have been only marginally successful. The most common technique has been to follow the chlorine plasma etch of the metallization pattern with exposure to a fluorine-containing plasma. One such fluorine passivation technique is described in co-pending U.S. patent application, Ser. No. 172,745, filed July 28, 1980, now U.S. Pat. No. 4,325,984, and assigned to the same assignee as the present application.

While post-etch exposure to a fluorine-containing plasma does alleviate the corrosion problem to a certain extent either by a halogen exchange reaction (fluorine for chlorine) or by removal of the chlorine species by etching of the silicon substrate, it does suffer from drawbacks. If a halogen exchange reaction is the operating mechanism, it is, in all likelihood, relatively inefficient. Halogen atoms increase in size with increasing atomic number. Therefore, the smaller fluorine atoms are less likely to replace chlorine atoms by momentum transfer than are bromine or iodine atoms. Furthermore, halogen compounds are decreasingly reactive with increasing atomic number.

Attack of the substrate is not a particularly practical approach. Not only does such attack cause a higher step which must be covered with later films, but design rules and process parameters are such that active silicon device regions may be exposed to plasma. Such exposed areas are rapidly etched in a fluorine plasma resulting in device failure.

DISCLOSURE OF THE INVENTION

According to the method of the present invention, bromine-containing plasma is generated whereby bromine atoms bombard the surface of a chlorine-etched metallization pattern and displace more reactive chlorine atoms. The lower chemical reactivity of bromine with respect to chlorine prevents damage to the substrate during this process. With the loss of retained surface chlorine, the patterned aluminum or aluminum alloy film is much more resistant to corrosion induced by hygroscopic pickup from the ambient.

BEST MODE FOR PRACTICING THE INVENTION

A typical step in the fabrication of semiconductor devices is the formation of a conductive metallization pattern by etching a thin film of aluminum or aluminum alloy, such as aluminum/silicon or aluminum/silicon/copper, which covers an underlying layer of a semiconductor device. The underlying layer may be an insulating material such as silicon dioxide or silicon nitride. The metallization pattern to be etched from the film is defined by a patterned photoresist mask formed over the film such that only regions unmasked by photoresist will be etched. For best results, it is required that etching proceed to the interface between the metallization layer and the underlying layer without unduly undercutting the metallization. Chlorinated plasma etching provides this result.

According to one conventional aluminum or aluminum alloy plasma etching process, a suitable chlorinated etch gas, such as carbon tetrachloride is introduced to a reaction chamber, such as a conventional parallel plate reactor, containing a metallized wafer at about 60–70 cc per minute utilizing nitrogen gas at about 6 psia as a carrier gas. In this initial power-up stage of the etching process, the reactor power is about 3.5 amps and the reaction chamber pressure is maintained at about 250 millimicrons. After maintaining these conditions for about 3.5 minutes, the power is reduced to about 2.5 amps and the pressure is reduced to about 150 millimicrons. The reactor is then maintained at these conditions for about 20 minutes while plasma etching of the aluminum or aluminum alloy film proceeds.

Following the chlorine plasma etch, the reactor is purged, utilizing a combination of oxygen at a regulated flow of about 20 psia and nitrogen at a regulated flow of about 6 psia. During this "clean-up" portion of the process, the reactor power is maintaned at about 3.0 amps and the reactor pressure is maintained at about 400 millimicrons for about 5 minutes.

Following the purging step, power to the reactor is turned off and a bromine containing gas, preferably an organic such as methyl bromide or ethyl bromide, is introduced to the reactor at a regulated flow of about 15 psia along with oxygen at about 9-20 psia. The pressure of the reactor is held at about 300 millimicrons. The reactor is maintained at these conditions, that is, with just gas in the reactor and no power applied, for a waiting period of about two minutes. After the two-minute waiting period, power of about 3.0 amps is applied to the reactor for about 15 minutes to generate a bromine-containing plasma which acts to passivate the patterned aluminum or aluminum alloy film.

Plasmas generated from methyl bromide or ethyl bromide sources gases will retain these gases since only a percentage of the source gas actually becomes an ionized plasma. Both methyl and ethyl bromide will react with aluminum and aluminum chloride to form alkyl aluminum compounds which subsequently react with water to form the alkane and aluminum oxide. This reaction aids in clearing the etched areas and passivating the patterned film.

By controlling the amount of source gas utilized as well as the pressure and time parameters of the reactor, isotropy may be added to or substracted from the process.

I claim:

1. A method for inhibiting corrosion of aluminum or aluminum alloy films which have been etched utilizing chlorinated plasma comprising exposing the etched film to bromine-containing plasma.

2. The method as in claim 1 wherein the source gas utilized for generating the bromine-containing plasma includes methyl bromide.

3. The method as in claim 1 wherein the source gas utilized for generating the bromine-containing plasma includes ethyl bromide.

4. A method for inhibiting corrosion of an aluminum or aluminum alloy film which has been etched in a reactor utilizing chlorinated plasma, comprising the sequential steps of:
    (a) purging the reactor utilizing a combination of oxygen and nitrogen;
    (b) introducting a bromine-containing gas into the reactor; and
    (c) generating a bromine-containing plasma within the reactor.

5. A method as in claim 4 wherein the bromine-containing gas includes methyl bromode.

6. A method as in claim 5 wherein the bromine-containing plasma is generated by applying power of about 3.0 amps to the reactor.

7. A method as in claim 6 wherein the power is applied to the reactor for about 15 minutes.

8. A method for inhibiting corrosion of an aluminum or aluminum alloy film which has been etched in a reactor utilizing chlorinated plasma, comprising the sequential steps of:
    (a) introducing a combination of oxygen and nitrogen to the reactor for about 5 minutes while maintaining the reactor power at about 3.0 amps and the reactor pressure at about 400 millimicrons;
    (b) turning off the reactor power and introducing methyl bromide to the reactor for about 2 minutes while maintaining the reactor pressure at about 300 millimicrons; and
    (c) generating a methyl bromide plasma in the reactor by applying a power of about 3.0 amps to the reactor for about 15 minutes while maintaining the reactor pressure at about 300 millimicrons.

* * * * *